United States Patent

Cala et al.

[11] Patent Number: 5,814,588
[45] Date of Patent: Sep. 29, 1998

[54] AQUEOUS ALKALI CLEANING COMPOSITIONS

[75] Inventors: Francis R. Cala, Highland Park; Richard A. Reynolds, Plainsboro, both of N.J.

[73] Assignee: Church & Dwight Co., Inc., Princeton, N.J.

[21] Appl. No.: 617,606

[22] Filed: Mar. 19, 1996

[51] Int. Cl.[6] .............................. C11D 1/722; C11D 3/10; C11D 3/37; C11D 3/28
[52] U.S. Cl. ........................ 510/175; 510/254; 510/255; 510/245; 510/420; 510/421; 510/252
[58] Field of Search ................................. 510/175, 254, 510/255, 245, 420, 421, 252

[56] References Cited

U.S. PATENT DOCUMENTS

| | | |
|---|---|---|
| 3,173,903 | 3/1965 | Lukach et al. . |
| 3,176,052 | 3/1965 | Peticolas . |
| 3,637,511 | 1/1972 | Yang . |
| 4,106,901 | 8/1978 | Bishop et al. . |
| 4,135,878 | 1/1979 | Bishop et al. . |
| 4,201,686 | 5/1980 | Augustijn . |
| 4,233,171 | 11/1980 | McLaughlin et al. . |
| 4,389,371 | 6/1983 | Wilson et al. . |
| 4,450,102 | 5/1984 | Lindstrom et al. . |
| 4,540,442 | 9/1985 | Smith et al. . |
| 4,569,861 | 2/1986 | Smith et al. . |
| 4,575,569 | 3/1986 | Edwards . |
| 4,793,942 | 12/1988 | Lokkesmoe et al. . |
| 4,820,436 | 4/1989 | Andree et al. . |
| 4,878,951 | 11/1989 | Pochard et al. ................ 134/22.17 |
| 4,918,959 | 4/1990 | Parazak et al. . |
| 5,049,303 | 9/1991 | Secemski et al. . |
| 5,093,031 | 3/1992 | Login et al. . |
| 5,152,911 | 10/1992 | Savio et al. . |
| 5,230,824 | 7/1993 | Carlson et al. . |
| 5,275,755 | 1/1994 | Sebag et al. . |
| 5,431,847 | 7/1995 | Winston et al. . |
| 5,593,339 | 1/1997 | Yam et al. ................................ 451/36 |
| 5,593,504 | 1/1997 | Cala et al. ................................ 134/1 |

*Primary Examiner*—Paul Lieberman
*Assistant Examiner*—Charles Boyer
*Attorney, Agent, or Firm*—Irving Fishman

[57] ABSTRACT

Aqueous alkali cleaning compositions containing an alkali metal salt, an N-alkyl pyrrolidone derivative, and specific ethylene oxide/propylene oxide block copolymers having molecular weights of from about 1500 to about 2500. Such compositions can be employed as an aqueous concentrate or solution to clean a substrate such as a circuit board, wiring board or metal surface. Specific ethylene oxide/propylene oxide block copolymers protect plastic parts from corrosion by N-alkyl pyrrolidone derivatives without compromising N-alkyl pyrrolidone derivative cleaning ability.

39 Claims, 3 Drawing Sheets

AQUEOUS ALKALI CLEANING COMPOSITIONS

BACKGROUND OF THE INVENTION

The present invention is directed to improvements in aqueous alkali cleaning compositions. In particular, the present invention is concerned with aqueous alkali cleaning compositions which contain an N-alkyl pyrrolidone derivative and a specific compound for preventing corrosion of plastic.

It has been found that solder fluxes contained on electronic circuit assemblies, such as printed circuit boards and printed wiring boards, can be effectively removed by contact with aqueous compositions of alkaline salts such as alkali metal carbonates and alkali metal bicarbonates and mixtures thereof. Addition of certain surfactants, especially N-alkyl pyrrolidone derivatives, to aqueous compositions of alkaline salts improves cleaning effectiveness of aqueous alkaline solutions. N-alkyl pyrrolidone derivatives which are particularly good cleaning surfactants are the N-(n-$C_6$-$C_{14}$) 2 pyrrolidones. Such pyrrolidones have been employed in aqueous alkaline compositions to clean printed circuit boards and wiring boards of solder fluxes and other contaminants, and to clean contaminants from metal surfaces. It has further been found that addition of certain compounds such as alkali metal silicates, magnesium salts and the like to such formulations greatly improves corrosion protection of ceramic and metal components on such electronic assemblies.

Cleanliness of electronic circuit assemblies (ECA), such as printed circuit boards (PCB) or printed wiring boards (PWB), is regarded as being critical to their functional reliability. Ionic and nonionic contamination on circuit assemblies is believed to contribute to premature failures of circuit assemblies by allowing short circuits to develop.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In fabrication of electronic circuit assemblies, e.g., printed circuit boards, soldering fluxes first are applied to a substrate board material to ensure firm, uniform bonding of the solder. These soldering fluxes fall into two broad categories: rosin and non-rosin, or water soluble, fluxes. Rosin fluxes, which are moderately corrosive and have a much longer history of use, still are used widely throughout the electronics industry. Water soluble fluxes, which are a more recent development, are being used increasingly in consumer products applications. Because water soluble fluxes contain strong acids and/or amine hydrohalides, such fluxes are very corrosive. Unfortunately, residues of any flux can cause circuit failure if residual traces of flux are not removed carefully following soldering and thus remain on an electronic circuit assembly.

While water soluble fluxes can be removed with warm, soapy water, removal of rosin flux from printed circuit boards is more difficult and has therefore traditionally been carried out with the use of chlorinated hydrocarbon solvents such as 1,1,1,-trichlorethane, trichloroethylene, trichloromonofluoromethane, methylene chloride, trichlorotrifluoroethane (CFC113), tetrachlorodifluoroethane (CFC112) or mixtures or azeotropes of these and/or other solvents. Such solvents are undesirable, however, because they are toxic, and when released into the environment deplete the ozone layer and/or contribute to the greenhouse global warming effect and are not readily biodegradable and thus are hazardous for long periods of time. Thus, use of such solvents is subject to close scrutiny by the Occupational Safety and Health Administration (OSHA) and the Environmental Protection Agency (EPA), and stringent containment equipment must be used.

Alkaline cleaning compounds known as alkanolamines, usually in the form of monoethanolamine, have been used for rosin flux removal as an alternative to toxic chlorinated hydrocarbon solvents. Such high pH compounds (e.g., about 12 pH), chemically react with rosin flux to form a rosin soap through the process of saponification. Other organic substances such as surfactant or alcohol derivatives can be added to alkanolamine cleaning compounds to facilitate removal of such rosin soap. Unfortunately, such organic compounds, as well as water soluble soldering fluxes, have a tendency to cause corrosion on surfaces and interfaces of printed wiring boards if such compounds and fluxes are not completely and rapidly removed during fabrication of wiring and circuit boards.

In other approaches, Daley et al., U.S. Pat. No. 4,635,666 utilize a highly caustic solution having a pH of 13 in a batch cleaning process. This method severely oxidizes solder applied to circuit boards. In Hayes et al., U.S. Pat. Nos. 4,640,719 and 4,740,247 rosin soldering flux and other residues are removed from electronic assemblies by means of terpene compounds in combination with terpene emulsifying surfactants by rinsing in water.

Complete removal of adhesive and other residues also pose a problem. During manufacture of electronic circuit assemblies components are mounted on the upper surface of the board with leads protruding downwardly through holes in the board and are secured to the bottom surface of the board by means of an adhesive. Further, sometimes it is necessary to temporarily protect certain portions of boards from processing steps such as the process of creating corrosion resistant gold connecting tabs at board edges. Such transient protection of portions of circuit boards can be achieved by application of special adhesive tape to susceptible areas. Once such protection no longer is needed, adhesive tape must be removed. In both instances, a residue of adhesive generally remains which, if not thoroughly removed, can cause premature board failure. Removal of such adhesive residue traditionally has been carried out by use of chlorinated solvents which, as already described, are toxic and environmentally undesirable.

Thus, residual contaminants which are likely to be found on electronic circuit assemblies and which can be removed by compositions and methods of the present invention include, but are not limited to, for example, rosin flux, photoresist, solder masks, adhesives, machine oils, greases, silicones, lanolin, mold release, polyglycols and plasticizers.

Examples of excellent aqueous cleaning concentrates for cleaning circuit boards and wiring boards which are environmentally friendly and resolve many of the above problems of circuit board cleaning are disclosed in the U.S. Pat. No. 5,431,847, issued to Winston et al. and assigned to Church & Dwight, Princeton, N.J. In addition to employing excellent surfactant cleaning ability of N-alkyl pyrrolidone derivatives in their concentrates, Winston et al. also employ other cleaning surfactants such as block copolymers of ethylene oxide and propylene oxide, alkoxylated alcohols, carboxylated alkylene oxide condensates of fatty alcohols, and the like to enhance cleaning properties of the compositions.

In the area of metal cleaning, similar environmental problems of waste from metal cleaning compositions occur.

Although many existing solvents have shown to be good metal cleaners, such solvent cleaners generally employ various halogenated hydrocarbons and non-halogenated hydrocarbons. Such cleaners are toxic to the environment and can be dangerous, especially in closed environments such as garages and the like or in home usage.

Non-halogenated hydrocarbon solvents employed in metal cleaning such as toluene and Stoddard solvent and like organic compounds such as ketones and alcohols generally are flammable, have high volatility and have dubious ability to be recycled for continuous use. These, plus unfavorable safety, environmental and cost factors, put this group of solvents in a category which is unattractive for practical consideration. Most useful organic solvents are classified as volatile organic compounds (VOCs) which pollute the atmosphere, promote formation of toxic ozone at ground level, and add to the inventory of greenhouse gases.

The present assignee, Church and Dwight, has a number of excellent aqueous cleaning compositions which resolve many of the above mentioned problems observed with many organic solvent and aqueous metal cleaners. Examples of excellent aqueous cleaners are disclosed in copending U.S. patent application Ser. No. 08/311,268, assigned to Church & Dwight, which employ N-alkyl pyrrolidone derivatives along with other surfactants such as alkoxylated (thiol) surfactants, amine oxide surfactants, ethoxylated primary alkyl amines, and surfactants derived from condensation of ethylene oxide with a product resulting from a reaction of propylene oxide and ethylene diamine. Such aqueous cleaning compositions resolve many problems associated with organic solvents and many aqueous metal cleaners.

Although the aqueous circuit board cleaners and aqueous metal cleaners discussed above are excellent for their cleaning and metal anticorrosion purposes, a problem associated with cleaning compositions containing N-alkyl pyrrolidone derivatives is corrosion of materials composed of plastic such as drain pipes from cleaning stations where precision cleaning of circuit and wiring boards occur, or stations such as parts washers employed to clean metal parts and the like. Also plastic piping and tubing are frequently found in spray washers to spray, deliver or recirculate cleaning compositions to clean circuit and wiring boards, and metal parts. Because of the corrosive action of N-alkyl pyrrolidone derivatives on plastic, the cleaning industry is discouraged from employing the good cleaning ability of cleaning compositions containing N-alkyl pyrrolidone derivatives.

Unused or new plastic, such as chlorinated polyvinyl chloride, is a shiny, gray and rigid polymer. Corrosion of plastic material can be observed by swelling, change in color or weight gain and invariably, by a change in shine of plastic. Under the worst conditions of N-alkyl pyrrolidone derivative corrosion, plastics completely plasticize and dissolve into solution. Under slightly better conditions, plastics turn dark brown throughout, swell, gain weight and become rubbery, thus becoming useless. If the plastic is under any pressure, cracking and splitting also are observed. Under the very best corrosion prevention conditions, plastics retain their shine indefinitely.

Certain surfactants, such as alkoxylated alcohols, glycol ethers, and surfactants derived from sequential addition of ethylene oxide and propylene oxide to ethylenediamine, can slow down corrosion of plastic only but do not prevent corrosion. Consequently, plastics exposed to cleaning compositions containing such surfactants along with N-alkyl pyrrolidone derivatives eventually corrode and become useless.

Thus, there is a need for an improved aqueous alkali cleaning composition which employs the excellent cleaning ability of N-alkyl pyrrolidone derivatives, and prevents corrosion of plastics.

A primary objective of the present invention is to provide an aqueous alkali cleaning composition which employs N-alkyl pyrrolidone derivatives and prevents corrosion of plastics.

Another objective of the present invention is to provide an aqueous alkali cleaning composition which is effective to clean flux, grease oil and other contaminants from circuit and wiring boards without being excessively corrosive to a substrate and irritating to human skin, and is environmentally friendly.

A further objective of the present invention is to provide an aqueous alkali cleaning composition which effectively cleans grease, oil and other contaminants from a metal surface.

Still yet another objective of the present invention is to provide an aqueous alkali cleaning composition which can be used effectively in immersion and impingement type parts washers to effectively remove grease, oil and other contaminants from metal parts and which is safe to use and not a hazard to the environment upon disposal.

Other objectives and advantages of the present invention are apparent from the disclosure which follows, and will become apparent to those of skill in the art upon practicing the present invention.

SUMMARY OF THE INVENTION

In accordance with the present invention, aqueous alkali cleaning compositions containing an N-alkyl pyrrolidone derivative, and specific ethylene oxide/propylene oxide block copolymers which prevent corrosion of plastic are provided. Advantageously, specific ethylene oxide/propylene oxide block copolymers employed in compositions of the present invention prevent N-alkyl pyrrolidone derivatives from corroding polymer plastics without compromising cleaning efficacy of N-alkyl pyrrolidone derivatives. Such aqueous alkali cleaning compositions are useful for removing rosin solder fluxes and other residues from electronic circuit board assemblies during fabrication of such boards. As a result, any possibility of premature circuit failure which might occur in absence of such cleaning is eliminated or greatly reduced. Cleaning efficacy of compositions of the present invention is such that printed wiring boards thus treated meet stringent U.S. Department of Defense specifications.

Additionally, aqueous alkali cleaning compositions of the present invention effectively clean metal surfaces, such as aluminum, copper, iron, and the like by removing oil, grease and other contaminants, while at the same time inhibiting corrosion of metal surfaces.

Further, compositions of the present invention are characterized as having low environmental impact, unlike chlorinated hydrocarbon solvents and highly alkaline cleaners that have heretofore been employed to clean printed wiring boards, printed circuit board and metal surfaces. For example, alkali metal carbonate and bicarbonate salts employed to practice the present invention are naturally occurring and environmentally benign. Accordingly, rinse water can be sewered without treatment and minimal, if any, treatment is needed to remove organics from wash water before sewering, thus eliminating a need for costly water treating.

BRIEF DESCRIPTION OF THE DRAWINGS

Efficacy of the present invention invention will be better understood by reference to FIGS. 1–3 herein wherein test results of certain embodiments of the cleaning compositions of the present invention are illustrated.

DETAILED DESCRIPTION OF THE INVENTION

Figure 1:
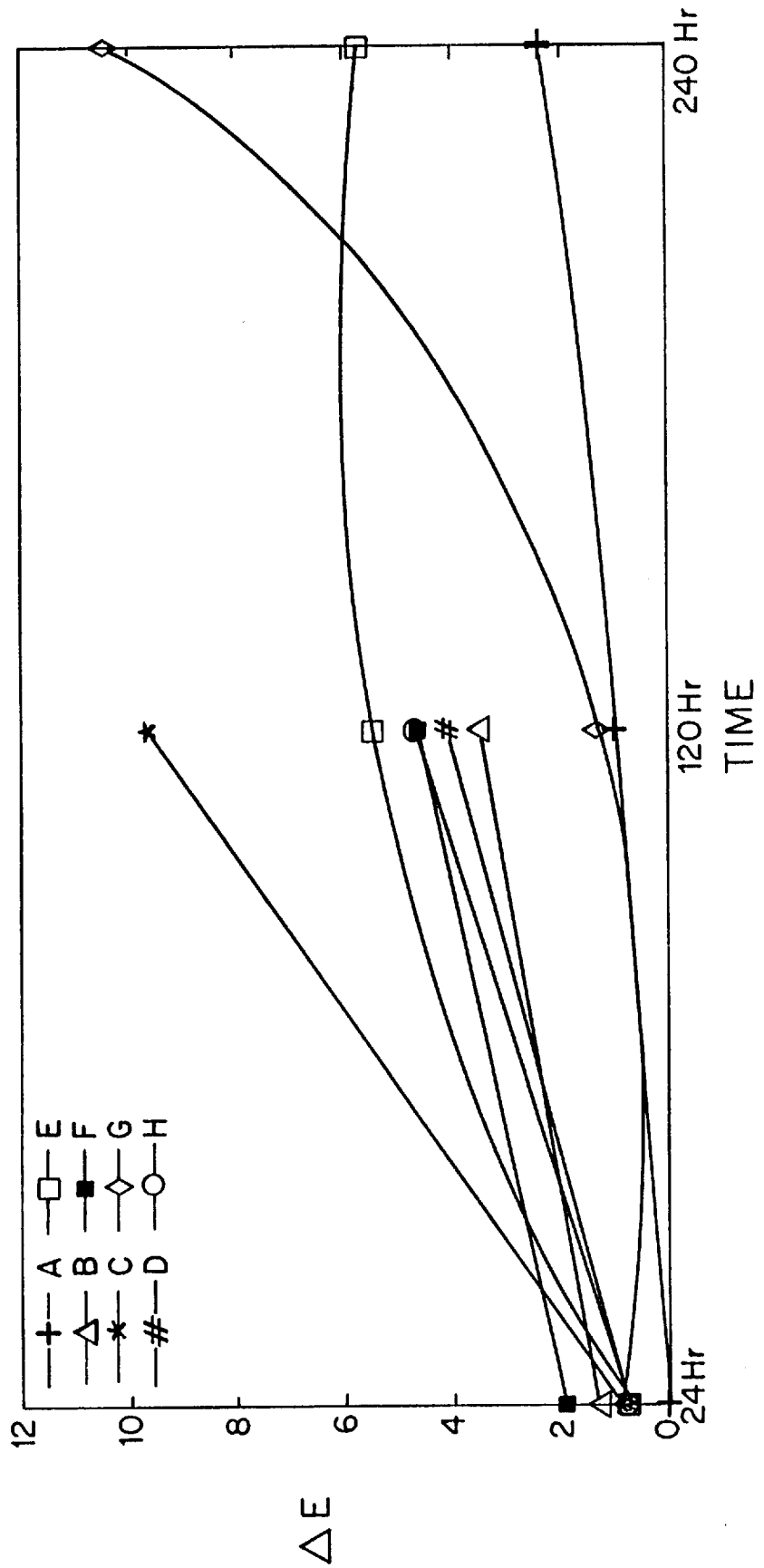
FIG. 1 is a graph showing color change of CPVC test coupons treated with aqueous concentrates containing N-(n-octyl) 2 pyrrolidone.

Aqueous alkali cleaning compositions of the present invention comprise an alkali metal salt, an N-alkyl pyrrolidone derivative and specific ethylene oxide/propylene oxide block copolymers which prevent N-alkyl pyrrolidone derivatives from corroding plastics. Many plastics which N-alkyl pyrrolidone derivatives corrode are found in drain pipes for disposing of cleaning solutions or jet sprays for applying cleaning solutions to clean circuit, wiring boards, or metal surfaces, and for pipes which recirculate cleaning solutions at cleaning stations.

The specific block copolymers prevent corrosion of plastic materials such as polyethers, polyesters and the like. Examples of such plastics include, but are not limited to, thermoplastics such as chlorinated polyvinyl chloride (CPVC), polycarbonate, vinylidene fluoride-hexafluoropropylene copolymer, ethylene propylene diene methylene copolymer, low density polyethylene terephathalate, polyvinyl chloride, and the like.

Essentially, aqueous alkali cleaning compositions of the present invention comprise mixtures of alkali metal salts which effectively remove flux from circuit and wiring boards. Accordingly, the term "flux removing" as used herein is intended to define the mixture of essentially active ingredients which comprises an alkali metal salt, an N-alkyl pyrrolidone derivative, a specific ethylene oxide/propylene oxide block copolymer, and any additional performance enhancers such as metal corrosion inhibitors and any other adjuvants such as additional surfactants, antifoam agents, etc. as hereinafter described.

The cleaning compositions or flux removing compositions preferably are formulated into concentrates. The terms "flux removing concentrated solutions" or "concentrates" as used herein define aqueous mixtures containing from about 5 to about 45, preferably, about 15 to about 30 percent by weight of flux removing compositions with the balance being essentially water.

In addition to removing flux from circuit and wiring boards, the alkali cleaning compositions of the present invention are useful for removing any type of contaminant from a metal surface including grease, cutting fluids, drawing fluids, machine oils, antirust oils such as cosmoline, carbonaceous oils, sebaceous oils, particulate matter, waxes, paraffins, used motor oil, fuels, etc. Any metal surface can be cleaned including iron-based metals such as iron, iron alloys, e.g., steel, tin, aluminum, copper, tungsten, titanium, molybdenum, etc., for example. Structures of metal surfaces to be cleaned can vary widely and are unlimited. Thus, the metal surface can be as a metal part of complex configuration, sheeting, coils, rolls, bars, rods, plates, disks, etc. Such metal components can be derived from any source including for home use, for industrial use such as for the aerospace industry, automotive industry, electronics industry, etc., wherein metal surfaces have to be cleaned.

As used herein the terms "flux removing solutions" or "flux removing solutions in use" are meant to define aqueous mixtures containing from about 0.1 to about 10 percent by weight of an alkali cleaning composition with the balance comprised essentially of water and which are solutions employed to clean circuit boards and metal surfaces. Also, as used herein, "flux removing composition" and "cleaning composition" have the same meaning since as stated previously, electronic circuit assemblies including printed circuit boards and printed wiring boards often contain residues other than fluxes which compositions of the present invention are able to remove and thus "flux removing composition" is intended as an all-purpose cleaner.

Any N-alky pyrrolidone derivative which can be employed as a surfactant is suitable to practice the present invention. Preferred N-alkyl pyrrolidone derivatives are N-(n-alkyl) pyrrolidones where an alkyl group contains from 6 to 22 carbon atoms. Most preferred pyrrolidones are N-(n-octyl) 2 pyrrolidone, N-(n-decyl) 2 pyrrolidone, N-(n-dodecyl) 2 pyrrolidone and N-(n-tetradecyl) 2 pyrrolidone. Such compounds are described in U.S. Pat. No. 5,093,031, assigned to ISP Investments, Inc., Wilmington, Del. and is incorporated herein in its entirety by reference. Such N-alkyl pyrrolidone derivatives having a molecular weight of from about 180 to about 450 are conveniently prepared by several known processes including a reaction between a lactone having the following formula

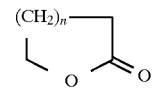

wherein n is an integer from 1 to 3, and an amine having the formula R'-NH$_2$ wherein R' is a linear alkyl group having 6 to 20 carbon atoms; amines derived from natural products, such as coconut amines or tallow amines distilled cuts or hydrogenated derivatives of fatty amines. Also, mixtures of amine reactants can be used in the process for preparing pyrrolidone compounds.

Generally, $C_6$ to $C_{14}$ alkyl pyrrolidones have been found to display primarily surfactant properties; whereas $C_{16}$ to $C_{22}$ alkyl species are primarily complexing agents; although some degree of surfactant and complexing capability exits in all such pyrrolidone species. N-(alkyl) pyrrolidone derivatives are employed in compositions of the present invention in amounts from about 0.1 to about 2.0 wt. %, preferably from about 1.0 to about 1.5 wt. % of a cleaning composition (without water).

Suitable alkaline salts or mixtures thereof employed to practice the present invention are those capable of providing a desired pH. Most suitable are salts of potassium, sodium and ammonium with potassium and sodium being preferred. Preferred are carbonates and bicarbonates and mixtures thereof which are economical, safe and environmentally friendly. Most preferred are carbonate salts. Such carbonate salts include potassium carbonate, potassium carbonate trihydrate, sodium carbonate, sodium carbonate decahydrate, sodium carbonate heptahydrate, sodium carbonate monohydrate, sodium sesquicarbonate and double salts and mixtures thereof. Preferably, alkaline cleaning salts used in compositions are alkali metal carbonates or hydrates thereof present in amounts of from about 10 to about 70 wt. % of the composition (without water), preferably, about 25 to about 45 wt. %. Thus, alkali metal carbonates can comprise from 0 to about 70 wt. % potassium carbonate, more preferably, about 10 to about 25 wt. % and 0 to about 50 wt. % sodium carbonate, more preferably, 5 to about 20 wt. % of a composition (without water).

Bicarbonate salts preferably include potassium bicarbonate and sodium bicarbonate and mixtures thereof. Alkali metal bicarbonates can be present in amounts of 0 to about 60 wt. % of the composition (without water), preferably, about 15 to about 40 wt. %.

Other suitable alkaline salts include alkali metal ortho or complex phosphates. Complex phosphates are effective because of their ability to chelate water hardness and heavy metal ions. Complex phosphates include, for example, sodium or potassium pyrophosphate, tripolyphosphate and hexametaphosphates. Additional suitable alkaline salts useful in cleaning compositions of the present invention include alkali metal borates, acetates, citrates, tartrates, gluconates, succinates, silicates, phosphonates, nitrilotriacetates, edates, etc.

Alkaline salts can be utilized in combination, and are used in concentrations such that resultant concentrates or solutions have a pH of from about 8 to less than 13, preferably from about 10 to less than 12 and, most preferably from about 10.9 to about 11.4. The desired pH of an aqueous cleaning composition can depend on types of contaminants removed. Thus, a lower pH range is desirable and effective for removing more easily removed contaminants. A pH of above 11.0 is preferred when removing more difficult to remove solder paste fluxes. However, at pHs of 12.6 and higher, solutions become increasingly toxic and corrosive to electronic circuit assemblies. Consequently, such high pH levels are preferably avoided. It is preferable that alkaline salts utilized in combination at dilution of a wash bath and at the desired pH also have an adequate reserve of titratable alkalinity, at least equivalent to about 0.2 to 4.5%, preferably from about 0.6 to 4.5% sodium hydroxide or caustic potash (potassium hydroxide), when titrated to the colorless phenolphthalein end point, which is at about pH 8.4 to maintain enhanced performance.

Alkali cleaning compositions of the present invention also comprise specific block copolymers of ethylene oxide/ propylene oxide as plastic anticorrosion agents. Such specific block copolymers of ethylene oxide/propylene oxide are effective for preventing corrosion of certain plastics by N-alky pyrrolidone derivatives. Such plastics typically are used to make drain pipes or tubing for cleaning apparatus where cleaning compositions containing N-alkyl pyrrolidone derivatives are employed. Specific block copolymers of ethylene oxide/propylene oxide suitable for practicing the present invention are based on addition of ethylene oxide and propylene oxide to a low molecular weight organic compound containing one or more active hydrogen atoms. Such block copolymers have a weight average molecular weight of from about 1500 to about 2500, and an HLB (hydrophile-lipophile balance) of about 1 to 7. Block copolymers capped with ethylene oxide (EO/PO/EO) have a hydrophile composition formed from the ethylene oxide or EO block of from about 5 to about 20 wt. %, preferably from about 5 to about 15 wt. % of the polymer. Block copolymers capped with propylene oxide (PO/EO/PO) have a hydrophobe composition formed from propylene oxide or PO block of from about 5 to about 20 wt. %, preferably from about 5 to about 15 wt. % of the polymers.

The specific polymers based on addition of ethylene oxide and propylene oxide to propylene glycol and ethylene glycol are commercially available under the names Pluronic® and Pluronic® R from BASF Wyandotte Corporation of Wyandotte, Mich. Pluronic® is based on addition of propylene oxide to two hydroxyl groups of propylene glycol followed by ethylene oxide addition to sandwich the propylene oxide hydrophobe between the ethylene oxide hydrophilic groups.

The structure is:

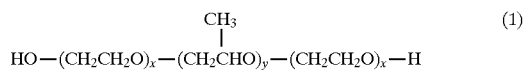

$$HO-(CH_2CH_2O)_x-(CH_2CHO)_y-(CH_2CH_2O)_x-H \quad (1)$$

Pluronic® R is based on addition of ethylene oxide to ethylene glycol followed by propylene oxide addition to sandwich the ethylene oxide hydrophile between the propylene oxide hydrophobic groups.

The structure is:

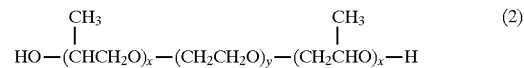

$$HO-(CHCH_2O)_x-(CH_2CH_2O)_y-(CH_2CHO)_x-H \quad (2)$$

where x and y in each of the above general formulas are integers such that the block copolymer has a molecular weight of from about 1500 to about 2500. Preferred specific ethylene oxide/propylene oxide block copolymers are based on addition of propylene oxide to two hydroxyl groups of propylene glycol followed by ethylene oxide to sandwich the hydrophobe between ethylene oxide hydrophilic groups (formula 1) with a hydrophile percent of about 10 and a molecular weight of about 2000. An example of such a block copolymer is Pluronic L61. Another preferred specific ethylene oxide/propylene oxide block copolymer is based on addition of ethylene oxide to ethylene glycol followed by propylene oxide addition to sandwich the hydrophile between hydrophobic groups (formula 2) with a hydrophobe percent of about 10 and a molecular weight of about 2000. An example of such a block copolymer is Pluronic 17R1. Such specific block copolymers can be prepared by various methods known in the art.

While not wishing to be held to any particular theory, it is believed that the specific ethylene oxide/propylene oxide block copolymers form an intermolecular equilibrium relationship with N-alkyl pyrrolidone derivatives where specific block copolymers of ethylene oxide/propylene oxide form a temporary micelle structure around N-alkyl pyrrolidone for a period of time long enough to prevent corrosion of plastic materials but releasing N-alkyl pyrrolidone derivatives for a sufficient amount of time to clean effectively. An alternative theory is that hydrophilic portions of N-alkyl pyrrolidone derivatives significantly interact by intermolecular forces, such as Van der Waals forces, with the specific block copolymers of ethylene oxide/propylene oxide, while minimally interacting with hydrophobic portions of N-alkyl pyrrolidone derivative molecules. Such interaction allows hydrophobic portions of N-alkyl pyrrolidone derivatives sufficient time to effectively clean, but not enough time to corrode plastic material.

To protect plastic parts from corrosion effects of N-alkyl pyrrolidone derivatives, the specific block copolymers of ethylene oxide/propylene oxide are included in cleaning compositions of the present invention in amounts of from about 0.5 to about 10 wt. % of a composition (without water), or from about 5.0 to about 7.1 times the weight of N-alkyl pyrrolidone derivatives added to a cleaning composition. Preferably, the specific block copolymers of ethylene oxide/propylene oxide are added in amounts of from about 1.0 to about 5 wt. %, most preferably from about 1.5 to about 3.0 wt. % of cleaning compositions (without water).

Alkaline compositions of the present invention can contain one or more additional corrosion inhibitors to prevent corrosion or pitting of connecting tabs or solder joints, metals or other materials present on circuit boards. Such additional anticorrosion agents include, but are not limited to, water soluble magnesium salts such as magnesium sulfate, magnesium nitrate, magnesium oxide and the like, and alkali metal silicate salts, such as sodium and potassium silicate salts.

Alkali metal silicates which are used can be in a variety of forms which can be encompassed generally by the formula $M_2O:SiO_2$ wherein M represents an alkali metal and in which the ratio of two oxides can vary. Most useful alkali metal silicates have an $M_2O$ to $SiO_2$ mole ratio of between 1:0.5 to 1:4.5. Most preferably, the $M_2O$ to $SiO_2$ ratio is between 1:1.6 and 1:4.0. Such silicates also provide additional alkalinity to wash water to help cleaning, and to promote brightness and shininess of solder joints. For sufficient corrosion protection, it is useful to add 0.1 to 25 wt. % of silicate corrosion inhibitor based on the amount of cleaning composition (without water). To enhance brightening, it has been found useful to include at least 10 wt. % silicate in compositions and, preferably, amounts of silicate greater than 15 wt. % can be used to ensure brightening of metal parts and removal of all white residues which tend to collect on metal components including solder joints.

At a pH below about 11.0 silicate can begin to precipitate from aqueous solutions such as a dilute wash bath. Silicate precipitation from aqueous concentrates of cleaning compositions also can occur. To aid in keeping silicate in solution, an anionic polymer can be added to the compositions.

Anionic homopolymers or copolymers with molecular weights between about 1,000 to about 5,000,000 or mixtures thereof can be employed in this invention as silicate stabilizers. Optimal polymers are ones which dissolve easily and do not increase solution viscosity to excessive levels when added at concentrations required for optimum silicate stability.

The following anionic polymers are non inclusive examples of those suitable for stabilizing silicate solutions according to this invention: carboxymethylcellulose, polyacrylic acid, polymethacrylic acid, polymaleic acid, polyglycolic acid, heteropolymers of acrylic and methacrylic acid, xanthan gum, carrageenan gum and alginate gum. In alkaline concentrates or solutions of the present invention, anionic polymers are present essentially in the form of the sodium or potassium salts thereof. Additional alkali can be added to neutralize the polymers.

Preferably, polyacrylic acids, such as in the form of sodium polyacrylate in solution, can be employed as solder silicate stabilizing agents. Polyacrylates used in this embodiment preferably have molecular weight of between about 100,000 and 4,000,000, preferably from over 150,000 to 4,000,000. An especially preferred molecular weight range is about 250,000 to 2,000,000. Examples of such polymers are marketed under the tradename "Carbopol", from B. F. Goodrich. It is believed that anionic polymers which are particularly useful in this invention form stable solutions or suspensions in water and have a folded or cross-linked structure which provides a three-dimensional porous matrix in solution. Pores in this matrix have an adequate size to entrap alkali metal silicates.

Relatively small amounts of the anionic polymer are effective. Thus, at a pH below 11.0 and at silicate concentrations of about 0.5 to about 10.0 wt. % in a cleaning concentrate, amounts of polyacrylic acid needed for stabilization range from about 0.1 to 2 wt. %. When amounts of silicate ranging from about 1–8 wt. % are employed in concentrates, about 0.3 to about 1.2 wt. % of polyacrylic acid stabilizer is used relative to the concentrates.

It also is useful to include at least one antifoam agent in any of the cleaning compositions of the present invention. Antifoam agents are utilized to prevent formation of excessive foam caused by rosin flux/flux removing combinations. Presence of foam interferes with mechanical action of cleaning equipment used to wash circuit boards. It is important, if not critical, that antifoam agents used herein do not act by replacing flux film with another residual surface film which can affect performance of an electronic circuit board in use. Antifoam agents can be agents which solely act to inhibit foam, or can be a surfactant which help clean boards and emulsify soils.

Preferred examples of antifoam agents include compounds formed by condensing ethylene oxide with a hydrophobic base formed by condensation of propylene oxide with propylene glycol. Hydrophobic portions of the molecule which exhibit water insolubility have a molecular weight of from about 1,500 to 1,800. Addition of polyoxyethylene radicals to such hydrophobic portions tend to increase water solubility of the molecule as a whole and the liquid character of the product is retained up to a point where polyethylene content is about 50 percent of the total weight of the condensation product. Examples of such compositions are the "Pluronics" sold by BASF-Wyandotte. Such compounds also enhance flux removal.

Other suitable antifoam agents that also enhance flux removal include: Polyethylene oxide/polypropylene oxide condensates of alkyl phenols having an alkyl group containing from about 6 to 12 carbon atoms in either a straight chain or branched chain configuration with ethylene oxide/ propylene oxide, ethylene oxide being present in amounts equal to 1 to 25 moles of ethylene oxide per mole of alkyl phenol and propylene oxide being present in amounts equal to 1 to 25 moles of propylene oxide per mole of alkyl phenol. Alkyl substituents in such compounds can be derived from polymerized propylene, diisobutylene, octene, or nonene, for example.

Also suitable are compounds derived from condensation of ethylene oxide with the product resulting from reaction of propylene oxide and ethylene-diamine or from the product of the reaction of a fatty acid with sugar, starch or cellulose. For example, compounds containing from about 40 percent to about 80 percent polyoxyethylene by weight and having a molecular weight of from about 5,000 to about 11,000 resulting from the reaction of ethylene oxide groups with a hydrophobic base constituted of the reaction product of ethylene diamine and excess propylene oxide, and hydrophobic bases having a molecular weight on the order of 2,500 to 3,000 are satisfactory.

In addition, condensation products of aliphatic alcohols having from 8 to 18 carbon atoms, in either straight chain or branched chain configuration, with ethylene oxide and propylene oxide, e.g., a coconut alcohol-ethylene oxide-propylene oxide condensate having from 1 to 30 moles of ethylene oxide per mole of coconut alcohol, and 1 to 30 moles of propylene oxide per mole of coconut alcohol, the coconut alcohol fraction having from 10 to 14 carbon atoms, also can be employed.

Antifoam agents of the present invention preferably are employed in flux removing compositions (without water) at about 0.01 to about 10 wt. % and in flux removing concentrates in amounts of up to about 1.0 percent by weight, preferably, about 0.10 to about 0.50 percent by weight based on the total weight of the aqueous flux removing concentrate. Thus, antifoam agents can be included in flux removing compositions, aqueous concentrates or added directly to aqueous wash baths as long as addition results in desired concentration during use.

In addition to N-alkyl pyrrolidone derivatives, the present invention also contemplates use of other surfactants in aqueous cleaning-solutions in order to enhance wetting and emulsifying ability of cleaning solutions and permit maximum penetration thereof within regions of circuit boards most difficult to clean. Additional surfactants used can be agents also used to control foam. Suitable surfactants include anionic, nonionic, anionic surfactants or amphoteric surfactants or combinations thereof. Surfactants preferably are soluble, stable and, preferably, nonfoaming in use. A combination of surfactants can be employed. The term "surfactant", as used herein, can include other forms of dispersing agents or aids.

It has been found especially effective to use alkoxylated alcohols which are sold under the tradename of "Polytergent SL-Series" as surfactants, such as Polytergent SL 42 by Olin Corporation. Also, polycarboxylated ethylene oxide condensates of fatty alcohols manufactured by Olin under the tradename of "Polytergent CS-1" have been found effective, especially in combination with the above Polytergent SL-Series surfactants. An effective surfactant which also provides antifoam properties are alkoxylated linear alcohols such as "Polytergent SLF-18" also manufactured by Olin. A combination of this surfactant together with the above two surfactants has been found to provide excellent cleaning with low foam.

Ethoxylated alcohols with 8 to 20 carbons, such as those containing from 3 to 30 moles of ethylene oxide per mole of alcohol also can be used as surfactants in this invention. A preferred method of preparing such low foaming surfactants is by end-capping an ethoxylated alcohol with propylene oxide. Monocarboxylated derivatives of such surfactants also can be used.

Sodium or potassium salts of sulfonated benzene or naphthalene derivatives such as alkyl benzene sulfonate, or alkyl naphthalene sulfonate or disulfonate can be used. However, caution preferably is employed as such surfactants can impart excessive uncontrollable foam to the wash water.

Amount of surfactants utilized range from about 1 to about 15 wt. % of the composition but can vary depending on conditions and contamination encountered, and higher surfactant levels can be employed if so desired. Preferably, surfactant comprises from about 5 to about 10 wt. % of the composition.

A hydrotrope can be included to help solubilize any organic adjuvants such as surfactants, anti-foam agents, etc. which are contained in salt-containing concentrates. Hydrotrope is present in amounts of from about 2 to about 15 wt. % preferably from about 8 to about 12 wt. % of a composition (without water). Preferred hydrotropes comprise alkali metal salts of intermediate chain length monocarboxylic fatty acids, i.e., $C_7$–$C_{13}$. Other adjuvants also can be added to improve properties or performance of the aqueous cleaning compositions.

It has been found that concentrates of the present invention preferably be prepared hot for example at between about 50° to about 90° C. Polymers first are dissolved in water. This can be facilitated using a homogenizer. Silicate then is added as a concentrated solution. Alkaline salts then are added, followed by surfactants and other ingredients.

Aqueous cleaning solutions which are employed in cleaning procedures described herein usually contain from about 0.1 to about 10, or more, weight percent, preferably, from about 0.6 to about 5 weight percent and, most preferably, from about 1 to 3 weight percent of a cleaning composition of the present invention with the balance being water. An upper limit of concentration of cleaning composition is not critical and is determined by fabrication conditions, amount of residues and difficulty of removing same from circuit assemblies, etc. Preferably, deionized water is used for both solutions and, as well, concentrates of the present invention.

Applicability of compositions of the present invention to various aspects of printed circuit/wiring board fabrication processes can best be understood by a description of a representative assembly process.

An assembly manufacturing process involves placement of components such as integrated circuits, resistors, capacitors, diodes, etc. on a board's or insertion through pre-drilled holes. Components then are secured by soldering, by mechanical or automatic means. Interspersed with soldering operations are cleaning procedures and inspections to ensure that tape and solder flux residues which can lead to premature circuit failure do not remain.

For removal of rosin soldering flux deposits and other residues during printed circuit/wiring board fabrication, compositions of the present invention can be applied to boards by immersion in dip tanks or by hand or mechanical brushing. Alternatively, such compositions can be applied by any commercially available printed wiring board cleaning equipment. Dishwasher size units can be employed, or much larger cleaning systems such as "Poly-Clean+" and various "Hydro-Station" models produced by Hollis Automation, Inc. of Nashua, N.H.

Depending upon their design, such washers can apply cleaning compositions of the present invention by spraying with mechanical nozzles or by rolling contact with wetted roller surfaces. Temperatures at which compositions can be applied can range from room, or ambient, temperature (about 70° F.) to about 180° F., preferably, about 140° to 170° F. Cleaning compositions or concentrates are diluted with water from as low as about 0.1 percent by weight (or volume) concentration to up to about 10 percent by weight.

Once solder flux has been loosened and removed during a period of contact which typically ranges from about 1 to about 5 minutes, but can be up to about 10 minutes circuit/wiring boards are taken from the flux removing solution. Another advantage of the instant invention is that cleaning solutions need not be flushed with solvents as with many other currently employed processes using organic solvents or strong alkaline aqueous compositions. Herein, boards can simply be flushed with water for a period of up to about 2 minutes. Deionized water is preferred. Optimal rinsing time varies according to kinds of surfactants and concentrations of cleaning solutions used and can easily be determined by routine experimentation. Advantageously, cleaning compositions of the present invention can be recycled through circuit board cleaning apparatus and reused for further cleaning without fear that such cleaning compositions cause corrosion of plastic parts of the apparatus. Any chance of corrosion is prevented by employing block copolymers of ethylene oxide/propylene oxide as described above. Because plastic components of cleaning apparatus are protected from corrosion by N-alkyl pyrrolidone derivatives, cleaning solutions of the present invention advantageously can employ the superior cleaning abilities of N-alkyl pyrrolidone derivatives.

Cleaned boards then are dried, preferably with forced air. Drying is expedited if the air is warmed, preferably to above about 100° F.

Efficacy of rosin soldering flux removal from printed wiring boards is such that the boards meet stringent military specifications for low resistivity after cleaning. For example, such boards meet the MIL-P-28809A standard for low resistivity of solvent extracts resulting when contamination has been removed from a circuit board cleaned according to MIL-P-55110C. Resistivity of such solvent extracts after cleaning boards is complete is most easily determined with an omega Meter. Omega meter is the registered trademark of Kenco Industries, Inc., Atlanta, Ga., for a microprocessor-controlled contamination test system that rapidly measures changes in resistivity due to contaminating ions.

Results of Omega Meter measurements are expressed in equivalent units of ug NaCl/in$^2$ or its metric equivalent. According to MIL-P-28809A, an acceptable resistivity value for a cleaned board is equivalent to about 2.2 ug NaCl/cm$^2$ or about 14 ug NaCl/in$^2$, but far better results are routinely obtained after solder flux has been removed with cleaning solutions of the present invention as disclosed in Example II.

Cleaning solutions of the present invention also are effective in removing other undesirable and deleterious substances and residues. One particularly troublesome substance is residue left by adhesive tape used during fabrication of electronic circuit assemblies.

During the process of gold plating connecting tabs to improve corrosion resistance, tin-lead residues must first be removed from any unplated tabs. Removal of these residues is carried out by use of etching chemicals that can damage other unprotected printed circuit/wiring board components. To protect vulnerable components from etching chemicals, boards are wrapped on both sides with an adhesive plating tape which forms a shield or splash guard for all but exposed tab areas. Etching chemicals then remove any tin-lead residues on any tabs, a nickel plate is applied as a base for gold, and gold plating of the tabs finally is carried out. Adhesive plating tape which is maintained in place through all of these etching and plating steps, then is removed. When the tape is removed following the nickel and gold plate step, it is at this point that cleaning compositions of the present invention can be used.

Thus, following removal of the tape, a silicone-based and/or rubber-based adhesive residue can remain on a board. Such residue easily can be removed by employing compositions of the present invention under the same conditions described above for solder flux removal. Exact operational parameters will be determined by the nature of adhesive residue and the tenacity with which it adheres to a board, but conditions as described above generally are effective. As in the case of solder flux removal, treatment of a board with aqueous alkali cleaning solutions of the present invention is followed generally by water flushing and air drying.

Efficiency of removal of adhesive residues from printed circuit/wiring boards by compositions of the present invention is such that no residues are visible after cleaning. A simple 5–10x stereomicroscope can facilitate visual inspection for tape residues following cleaning.

The disclosure presented above is primarily concerned with electronic circuit assembly cleaners. It is to be well understood that the present invention also is directed to any aqueous cleaner in which the cleaning composition or aqueous cleaning concentrate comprises alkaline cleaning salts, an N-alkyl pyrrolidone to boost detersive action, and a specific block copolymer of ethylene oxide/propylene oxide having a molecular weight of from about 1500 to about 2500 as an anticorrosion agent. Useful products other than circuit board cleaning compositions as described above include laundry detergents, automatic dishwashing liquids, metal cleaning, carpet shampoos, floor tile cleaners, etc.

Many modifications and variations of the present invention can be made without departing from its spirit and scope, as will become apparent to those skilled in the art. The following examples are provided to further illustrate the present invention and are not intended to limit the scope of the present invention.

EXAMPLE I

To illustrate anticorrosion activity of aqueous alkali cleaning concentrates of the present invention on chlorinated polyvinyl chloride (CPVC) test-coupons, eight cleaning concentrates were prepared. Aqueous cleaning concentrates tested are listed in Tables 1 and 2.

Twenty four CPVC test coupons of ¾"×4"×⅛ were weighed. Three coupons each were submerged in each of eight concentrates disclosed in Tables 1 and 2 at 150 degrees F for periods of 24, 120 and 240 hours with each concentrate stirred at 600 rpm. Eight coupons were removed from each concentrate after time periods of 24, 120 and 240 hours; dried for 1 hour at 80 degrees C.; allowed to cool; re-weighed; measured for percent swelling by measuring change in the length, width and height of each coupon; and measured for color change on a calorimeter. Total average color change and total weighted degradation of each coupon are graphically displayed in FIGS. 1 and 2, respectively.

Color change is based on a three-dimensional scale which consists of color change of a material on a from black to white scale, a from green to red scale, and a from blue to yellow scale. Color change of a sample material is expressed by equation $\Delta E=(L^2+a^2+b^2)^{1/2}$ where variables L, a, and b represent a material's color change in the from black to white, from green to red, and the from blue to yellow regions, respectively. A calorimeter measures such changes of a test material under simulated conditions of total color change in incandescent light, total color change in north sky daylight (sunny day), and total color change in fluorescent light; and generates a repeatable number AE or total average color change in units of "total color change." Average total color change for each coupon is plotted on the graph in FIG. 1.

Average total color change values of 3 or below indicate that a CPVC test coupon showed no signs of corrosion, while numerical values above 3 clearly indicate corrosion on CPVC test coupons. Because all scientific measurements have some degree of error, the numerical zero point on the graph is not the statistically true zero point. The numerical value of 3 was determined as the "wobble" point, or the statistically true "0" point where no corrosion is observable. Such "wobble" points are determined visually by observing at what point test samples of CPVC show corrosion or noticeable physical change or noticeable beginning of change in appearance when treated in a solution similar to solution A in Table 1 (absent Pluronic L61) for 24 hours.

Coupons treated in concentrate A which contained an ethylene oxide/propylene oxide block copolymer with a molecular weight of about 2000 (Pluronic L61) did not show any color change after 24 hours, 120 hours, or 240 hours. In contrast, coupons treated in concentrates without Pluronic L61 (concentrates B to H) show considerable color change after 120 hours and 240 hours, thus clearly showing evidence of corrosion. Further, test coupons treated in test solutions B, C, D, F and H were extremely visibly corroded after 120 hours such that tests were not carried out in these solutions for a 240 hour time period.

Figure 2:
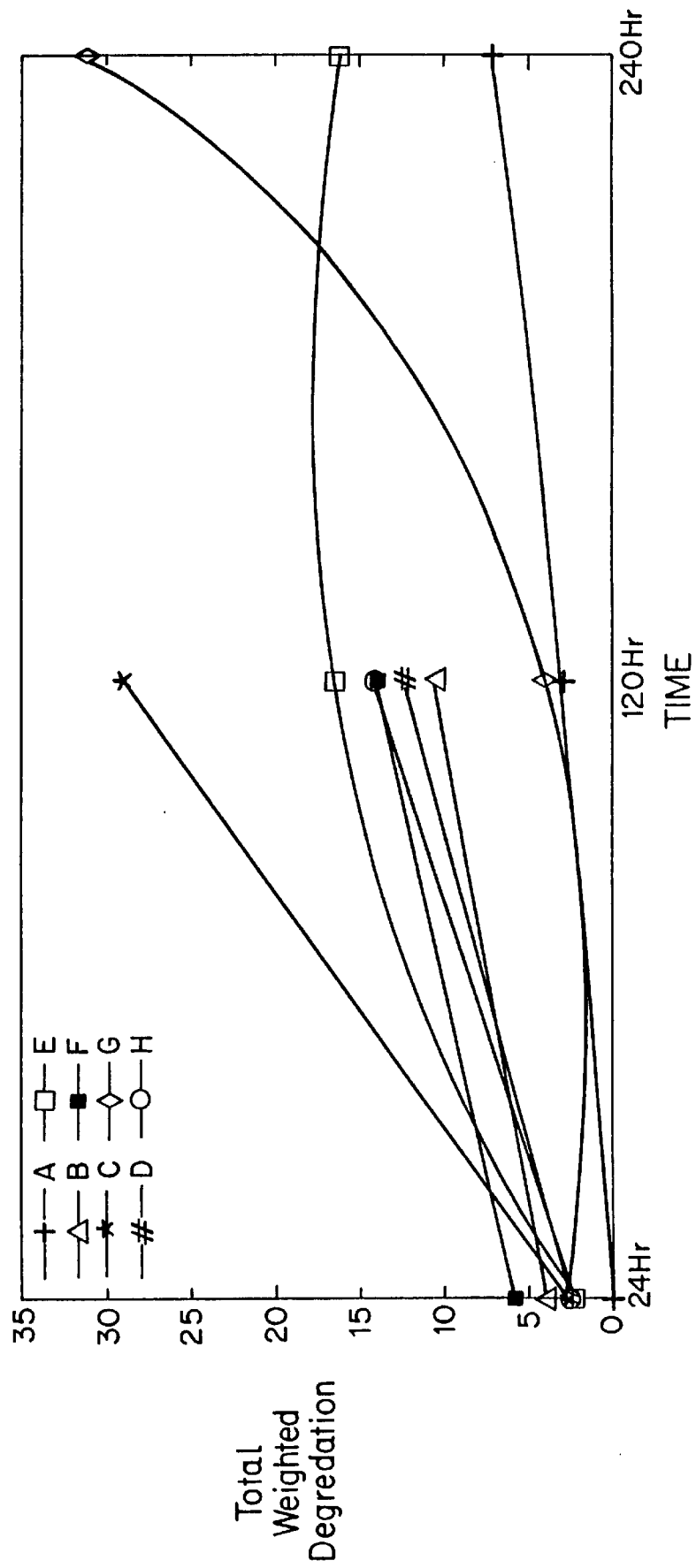
FIG. 2 is a graph showing weight degradation for CPVC test coupons treated with aqueous concentrates containing N-(n-octyl) 2 pyrrolidone.

FIG. 2 further supports the superior anticorrosion action of cleaning concentrates of the present invention. Total weighted degradation of each test coupon was determined by adding the change in weight of each coupon plus the percent swell of each coupon and ΔE for each coupon in a given test concentrate to determine an arbitrary number to represent the total weighted degradation of each test coupon. The "Wobble" point for total weighted degradation was determined to be about 10.0. Thus, numerical values for coupons exceeding about 10.0 show corrosion. Coupons treated in concentrate A definitely showed no weight degradation after 24 hours, 120 hours, or 240 hours. In contrast, coupons treated in the other test concentrates all showed corrosion by 120 hours of treatment except for coupons treated in solution G, but by 240 hours of treatment such coupons showed definite corrosion. Thus, the results of the test concentrates clearly show that the specific ethylene oxide/propylene oxide block copolymers of the present invention prevent corrosion of chlorinated polyvinyl chloride in contrast to concentrates which do not contain such block copolymers.

TABLE 1

CONCENTRATED FORMULAS (% WEIGHT)

| Ingredient | A | B | C | D |
|---|---|---|---|---|
| Water | 81.47 | 74.78 | 95.680 | 95.510 |
| Sodium Hydroxide | 0.28 | 0.68 | 0.068 | 0.042 |
| Plurafac RA40[1] | 0.00 | 0.00 | 2.000 | 0.000 |
| Potassium Carbonate | 5.15 | 7.81 | 0.781 | 0.773 |
| Sodium Carbonate | 4.55 | 6.90 | 0.690 | 0.683 |
| Kasil #1 (29.1% sol.)[2] | 3.12 | 4.73 | 0.473 | 0.468 |
| Monatrope 1250[3] | 2.75 | 2.15 | 0.215 | 0.413 |
| Polytergent CS-1 | 0.04 | 0.05 | 0.005 | 0.006 |
| Polytergent S405LF[4] | 0.10 | 0.15 | 0.015 | 0.015 |
| Polytergent SL42 | 0.23 | 0.35 | 0.035 | 0.035 |
| Surfadone LP100[5] | 0.35 | 0.40 | 0.040 | 0.053 |
| Pluronic L61[6] | 2.00 | 0.00 | 0.000 | 0.000 |
| Pluronic L31[6] | 0.00 | 2.00 | 0.000 | 0.000 |
| Pluronic 31R1[7] | 0.00 | 0.00 | 0.000 | 2.000 |

[1]Tradename for an alkoxylated surfactant alcohol manufactured by BASF Corporation.
[2]Potassium silicate
[3]Tradename for an intermediate chain-length monocarboxylic fatty acid.
[4]Tradename for a biodegradable alkoxylated linear alcohol manufactured by Olin Corporation.
[5]N-(n-octyl) 2 pyrrolidone surfactant.
[6]Tradename for an ethylene oxide/propylene oxide copolymer with a M.W. of about 1100 and 10% hydrophile manufactured by BASF Corporation.
[7]Tradename for a reverse ethylene oxide/propylene oxide copolymer with a M.W. of about 3250 and 10% hydrophile manufactured by BASF Corporation.

TABLE 2

CONCENTRATED FORMULAS (% WEIGHT)

| Ingredient | E | F | G | H |
|---|---|---|---|---|
| Water | 74.78 | 81.43 | 95.680 | 95.510 |
| Sodium Hydroxide | 0.68 | 0.28 | 0.068 | 0.042 |
| Potassium Carbonate | 7.81 | 5.15 | 0.781 | 0.773 |
| Sodium Carbonate | 6.90 | 4.55 | 0.690 | 0.683 |
| Kasil #1 (29.1% sol.) | 4.73 | 3.12 | 0.473 | 0.468 |
| Monatrope 1250 | 2.15 | 2.75 | 0.215 | 0.413 |
| Polytergent CS-1 | 0.05 | 0.04 | 0.005 | 0.006 |
| Polytergent S405LF | 0.15 | 0.10 | 0.015 | 0.015 |
| Polytergent SL42 | 0.35 | 0.23 | 0.035 | 0.035 |
| Polytergent SLF18 | 0.00 | 0.00 | 2.000 | 0.000 |
| Surfadone LP100 | 0.40 | 0.35 | 0.040 | 0.053 |
| Pluronic L61 | 0.00 | 0.00 | 0.000 | 0.000 |
| Industrol-DW5[1] | 2.00 | 0.00 | 0.000 | 0.000 |
| Pluronic L92[2] | 0.00 | 2.00 | 0.000 | 0.000 |
| Tetronic 150R1[3] | 0.00 | 0.00 | 0.000 | 2.000 |

[1]Tradename for a low foaming, alcohol alkoxylate surfactant, BASF Corporation.
[2]Tradename for an ethylene oxide/propylene oxide block copolymer with a M.W. of about 3725 and 20% hydrophile.
[3]Tradename for a block copolymer surfactant based on addition of propylene oxide and ethylene oxide to ethylene diamine, BASF Corporation.

EXAMPLE II

Four separate cleaning concentrates listed in Table 3 each were used to wash three separate sets of wiring boards except for cleaning concentrate I which was used to clean only two sets of boards. Each wiring board was soldered at 226 degrees C., and was washed with one of the four concentrates at 155 degrees F. for 7 minutes. The cleaning system employed was a "Poly-clean+" machine manufactured by Hollis Automation, Inc. of Nashua, N.H. Cleaning results of each set and the average of the sets for a given concentrate were determined and are shown in FIG. 3.

Figure 3:
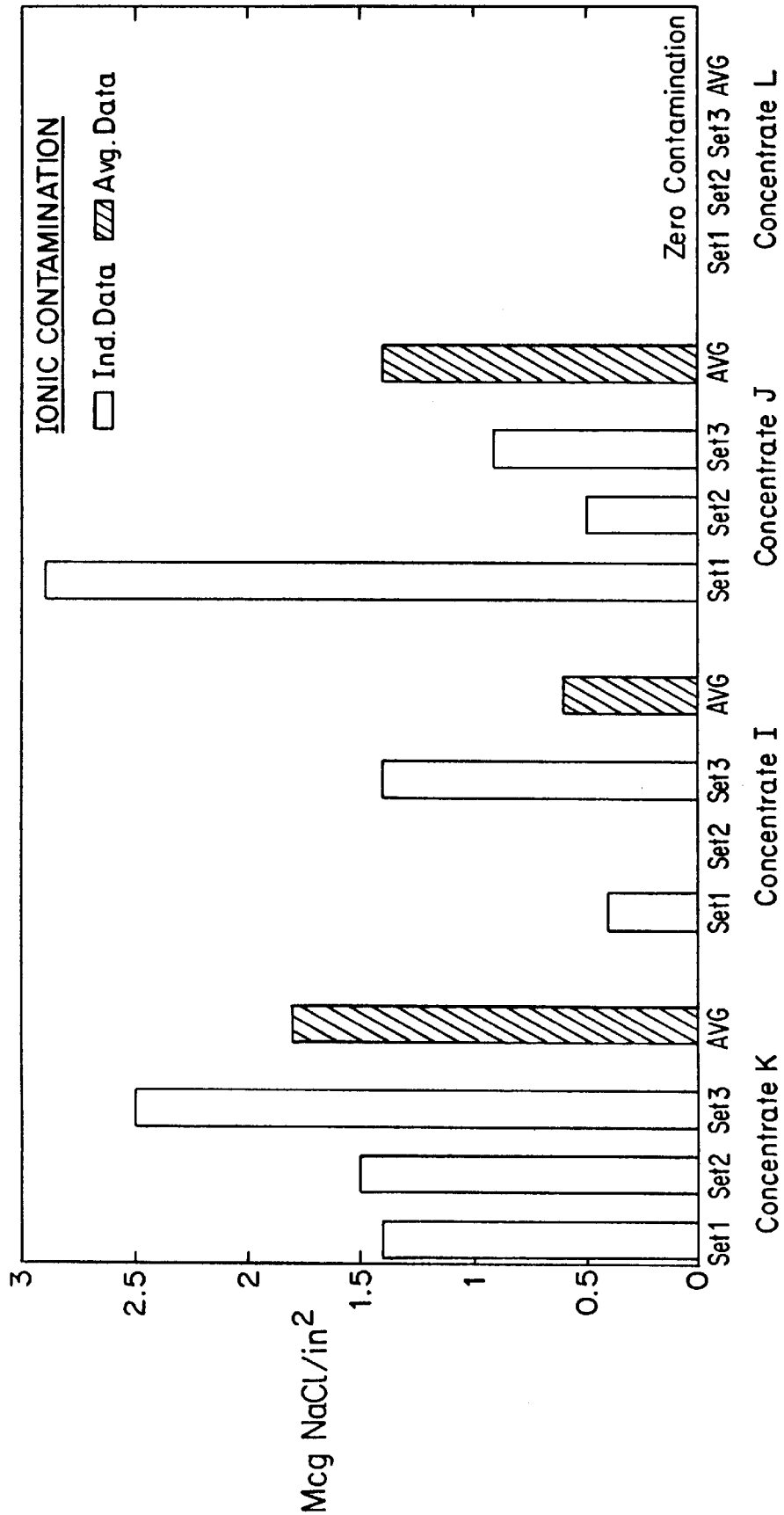
FIG. 3 is a bar graph contrasting cleaning ability of a cleaning concentrate of the present invention with cleaning concentrates outside the scope of the present invention.

FIG. 3 is a bar graph showing ionic contamination of boards washed in one of four concentrates of Table 3. The white bars show ionic contamination of each individual board washed in one of the four concentrates. The hatched bars show the average ionic contamination of all boards washed in a particular concentrate. The results in FIG. 3 show that wiring boards cleaned with composition L, which includes Pluronic L61 (ethylene oxide/propylene oxide block copolymer with a M.W. of about 2000 and 10% hydrophile), contain no contamination after cleaning, i.e., absence of any bars, in contrast to wiring boards washed in concentrates not containing Pluronic L61. Thus, in addition to preventing corrosion of CPVC, compositions of the present invention also show excellent cleaning ability.

TABLE 3

CLEANING CONCENTRATES (WEIGHT %)

| Ingredient | I | J | K | L |
|---|---|---|---|---|
| Water | 75.48 | 83.20 | 76.29 | 78.68 |
| Sodium Hydroxide | 0.68 | 0.28 | 0.28 | 0.28 |
| Carbopol 625 | 0.90 | 0.00 | 0.90 | 0.00 |
| Potassium Carbonate | 7.81 | 5.15 | 7.81 | 5.15 |
| Sodium Carbonate | 6.90 | 4.55 | 6.90 | 4.55 |
| Kasil #1 (29.1% sol.) | 4.73 | 3.12 | 4.73 | 3.12 |
| Monatrope 1250 | 2.15 | 2.72 | 2.15 | 2.75 |
| Polytergent CS-1 | 0.05 | 0.04 | 0.05 | 0.04 |
| Polytergent S405LF | 0.15 | 0.10 | 0.15 | 0.10 |
| Polytergent SL42 | 0.35 | 0.23 | 0.35 | 0.23 |
| Polytergent SLF18 | 0.40 | 0.26 | 0.39 | 0.26 |
| Surfadone LP100 | 0.40 | 0.35 | 0.00 | 0.35 |
| Pluronic L61 | 0.00 | 0.00 | 0.00 | 2.00 |

What is claimed is:

1. An aqueous alkali cleaning composition comprising an alkali metal salt, an N-alkyl-pyrrolidone derivative surfactant comprising from about 0.1 to about 2.0 wt. % of the composition, and an ethylene oxide/propylene oxide block copolymer having a formula:

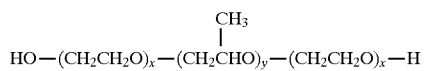

$$HO-(CH_2CH_2O)_x-(CH_2CHO)_y-(CH_2CH_2O)_x-H$$
$$\overset{|}{\underset{}{CH_3}}$$

wherein x and y are integers such that the block copolymer has a molecular weight of from about 1500 to about 2500, said block copolymer comprises from about 5.0 to about 7.1 times the weight of the N-alkyl-pyrrolidone derivative in the cleaning composition.

2. The aqueous alkali cleaning composition of claim 1, wherein ethylene oxide comprises from about 5 to about 15 wt. % of the block copolymer.

3. The aqueous alkali cleaning composition of claim 1, wherein the block copolymer has a molecular weight of about 2000 and an ethylene oxide percent of about 10.

4. The aqueous alkali cleaning composition of claim 1, wherein the alkali metal salts comprise carbonate salts, bicarbonate salts, or mixtures thereof.

5. The aqueous alkali cleaning composition of claim 1, wherein the N-alkyl pyrrolidone derivative comprises an N-(n-alkyl) 2 pyrrolidone.

6. The aqueous alkali cleaning composition of claim 5, wherein the N-(n-alkyl) 2 pyrrolidone comprises N-(n-octyl)

2 pyrrolidone, N-(n-decyl) 2 pyrrolidone, N-(n-dodecyl) 2 pyrrolidone, or N-(n-tetradecyl) 2 pyrrolidone.

7. The aqueous alkali cleaning composition of claim 1, further comprising a metal anticorrosion agent.

8. The aqueous alkali cleaning composition of claim 7, wherein the metal anticorrosion agent comprises magnesium salt, silicate salt or mixtures thereof.

9. The aqueous alkali cleaning composition of claim 1, wherein the ethylene oxide/propylene oxide block copolymer comprises from about 0.5 to about 10.0 wt. % of the composition.

10. The aqueous alkali cleaning composition of claim 1, comprising an additional surfactant.

11. The aqueous alkali cleaning composition of claim 10, wherein the additional surfactant is an alkoxylated alcohol.

12. The aqueous alkali cleaning composition of claim 10, wherein the additional surfactant is a polycarboxylated ethylene oxide condensate of a fatty alcohol.

13. The aqueous alkali cleaning composition of claim 1, further comprising a hydrotrope.

14. The aqueous alkali cleaning composition of claim 13, wherein the hydrotrope comprises an alkali metal salt of an intermediate chain length monocarboxylic fatty acid having from $C_7$–$C_{13}$ carbons.

15. An aqueous alkali cleaning concentrate comprising an alkali cleaning composition, wherein the cleaning composition comprises from about 5 to about 45 wt. % of the concentrate, the balance water, wherein an alkali metal salt comprises from about 10 to about 70 wt. % of the composition, an N-alkyl pyrrolidone derivative surfactant comprises from about 0.1 to about 2.0 wt. % of the composition, a metal anticorrosion inhibitor comprises from about 0.1 to about 25 wt. % of the composition, and further comprising an ethylene oxide/propylene oxide block copolymer having a formula:

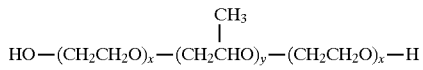

where x and y are integers such that the block copolymer has a molecular weight of from about 1500 to about 2500, said block copolymer comprises from about 5.0 to about 7.1 times the weight of the N-alkyl-pyrrolidone derivative in the cleaning composition.

16. The concentrate of claim 15, wherein ethylene oxide comprises from about 5 to about 15 wt. % of the copolymer.

17. The concentrate of claim 15, wherein the block copolymer has a molecular weight of about 2000 and an ethylene oxide percent of about 10.

18. The concentrate of claim 15, wherein the alkali metal salts comprise carbonate salts, bicarbonate salts or mixtures thereof.

19. The concentrate of claim 15, further comprising an additional surfactant.

20. The concentrate of claim 19, wherein the additional surfactant is an alkoxylated alcohol.

21. The concentrate of claim 19, wherein the additional surfactant is a polycarboxylated ethylene oxide condensate of a fatty alcohol.

22. The concentrate of claim 15, further comprising a hydrotrope.

23. The concentrate of claim 22, wherein the hydrotrope comprises an alkali metal salt of an intermediate chain length monocarboxylic fatty acid having from C7–C13 carbons.

24. The concentrate of claim 15, wherein the metal corrosion inhibitor comprises magnesium salts, silicate salts or mixtures thereof.

25. The concentrate of claim 15, wherein the N-alkyl pyrrolidone derivative comprises an N-(n-alkyl) 2 pyrrolidone.

26. The concentrate of claim 25, wherein the N-alkyl pyrrolidone derivatives comprises N-(n-octyl) 2 pyrrolidone, N-(n-decyl) 2 pyrrolidone, N-(n-dodecyl) 2 pyrrolidone, or N-(n-tetradecyl) 2 pyrrolidone.

27. The concentrate of claim 15, wherein the ethylene oxide/propylene oxide block copolymer ranges from about 0.5 to about 10 wt. % of the composition.

28. An aqueous alkali cleaning solution comprising an alkali cleaning composition, wherein the composition comprises from about 0.1 to about 10 wt. % of the solution, wherein an alkali metal salt comprises from about 10 to about 70 wt. % of the composition, a metal anticorrosion inhibitor comprises from about 0.1 to about 25 wt. % of the composition, an N-alkyl pyrrolidone derivative surfactant comprises from about 0.1 to about 20 wt. % of the composition, and further comprising an ethylene oxide/propylene oxide block copolymer having a formula:

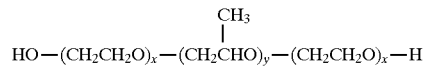

where x and y are integers such that the block copolymer has a molecular weight of from about 1500 to about 2500, said block copolymer comprises from about 5.0 to about 7.1 times the weight of the N-alkyl-pyrrolidone derivative in the cleaning composition.

29. The aqueous solution of claim 28, wherein ethylene oxide comprises from about 5 to about 15 wt. % of the block copolymer.

30. The aqueous solution of claim 28, wherein the block copolymer has a molecular weight of from about 2000 to about 2500 and an ethylene oxide percent of about 10.

31. The aqueous solution of claim 28, wherein the alkali metal salts comprise carbonate salts, bicarbonate salts or mixtures thereof.

32. The aqueous solution of claim 28, wherein the N-alkyl pyrrolidone derivative comprises an N-(n-alky) 2 pyrrolidone.

33. The aqueous solution of claim 32, wherein the N-(n-alkyl) 2 pyrrolidone comprise N-(n-octyl) 2 pyrrolidone, N-(n-decyl) 2 pyrrolidone, N-(n-dodecyl) 2 pyrrolidone, or N-(n-tetradecyl) 2 pyrrolidone.

34. The aqueous solution of claim 28, further comprising an additional surfactant.

35. The aqueous solution of claim 34, wherein the additional surfactant is an alkoxylated alcohol.

36. The aqueous solution of claim 34, wherein the additional surfactant is a polycarboxylated ethylene oxide condensate of a fatty acid.

37. The aqueous solution of claim 28, further comprising a hydrotrope.

38. The aqueous solution of claim 37, wherein the hydrotrope comprises an alkali metal salt of an intermediate chain length monocarboxylic fatty acid having from $C_7$–$C_{13}$ carbons.

39. An aqueous alkali cleaning composition comprising an alkali metal salt, an N-alkyl-pyrrolidone derivative surfactant, and an ethylene oxide/propylene oxide block copolymer having a formula:

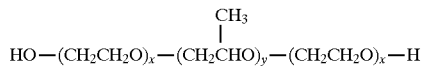

wherein x and y are integers such that the block copolymer has a molecular weight of from about 1500 to about 2500, said block copolymer comprises from about 0.5 to about 10 wt. % of the composition.

* * * * *